(12) United States Patent
Jain

(10) Patent No.: US 9,627,334 B2
(45) Date of Patent: Apr. 18, 2017

(54) SELF-ALIGNED UNDER BUMP METAL

(71) Applicant: Texas Instruments Incorporated, Dallas, TX (US)

(72) Inventor: Manoj K. Jain, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/278,072

(22) Filed: Sep. 28, 2016

(65) Prior Publication Data

US 2017/0018516 A1 Jan. 19, 2017

Related U.S. Application Data

(62) Division of application No. 14/559,215, filed on Dec. 3, 2014, now Pat. No. 9,478,510.

(60) Provisional application No. 61/918,367, filed on Dec. 19, 2013.

(51) Int. Cl.
*H01L 21/00* (2006.01)
*H01L 23/00* (2006.01)

(52) U.S. Cl.
CPC ............ *H01L 24/03* (2013.01); *H01L 24/05* (2013.01); *H01L 24/11* (2013.01); *H01L 24/13* (2013.01); *H01L 2224/03462* (2013.01); *H01L 2224/0401* (2013.01); *H01L 2224/05008* (2013.01); *H01L 2224/05022* (2013.01); *H01L 2224/05026* (2013.01); *H01L 2224/05084* (2013.01); *H01L 2224/05147* (2013.01); *H01L 2224/05155* (2013.01); *H01L 2224/05164* (2013.01); *H01L 2224/05181* (2013.01); *H01L 2224/05547* (2013.01); *H01L 2224/05557* (2013.01)

(58) Field of Classification Search
CPC ......... H01L 24/03; H01L 24/05; H01L 24/06; H01L 24/11; H01L 24/16; H01L 24/10
See application file for complete search history.

(56) References Cited

U.S. PATENT DOCUMENTS

| | | | | |
|---|---|---|---|---|
| 8,269,348 | B2 * | 9/2012 | Fazelpour | H01L 23/3114 257/691 |
| 8,314,474 | B2 * | 11/2012 | McLellan | H01L 23/5223 257/532 |
| 8,890,223 | B1 * | 11/2014 | Bonifield | H01L 27/0288 257/296 |
| 2005/0017376 | A1 * | 1/2005 | Tsai | H01L 24/10 257/786 |

(Continued)

*Primary Examiner* — Nicholas Tobergte
(74) *Attorney, Agent, or Firm* — Jacqueline J. Garner; Charles A. Brill; Frank D. Cimino

(57) ABSTRACT

An integrated circuit including a self-aligned under bump metal pad formed on a top metal interconnect level in a connection opening in a dielectric layer, with a solder ball formed on the self-aligned under bump metal pad. Processes of forming integrated circuits including a self-aligned under bump metal pad formed on a top metal interconnect level in a connection opening in a dielectric layer, by a process of forming one or more metal layers on the interconnect level and the dielectric layer, selectively removing the metal from over the dielectric layer, and subsequently forming a solder ball on the self-aligned under bump metal pad. Some examples include additional metal layers formed after the selective removal process, and may include an additional selective removal process on the additional metal layers.

10 Claims, 8 Drawing Sheets

(56) References Cited

U.S. PATENT DOCUMENTS

| | | | | |
|---|---|---|---|---|
| 2005/0245070 A1* | 11/2005 | Andricacos | ......... | H01L 21/2885 |
| | | | | 438/627 |
| 2008/0050905 A1* | 2/2008 | Uchida | ................... | H01L 24/03 |
| | | | | 438/614 |
| 2011/0101527 A1* | 5/2011 | Cheng | ..................... | H01L 24/11 |
| | | | | 257/738 |
| 2011/0121438 A1* | 5/2011 | Hart | ...................... | H01L 23/556 |
| | | | | 257/659 |
| 2012/0146212 A1* | 6/2012 | Daubenspeck | ......... | H01L 24/03 |
| | | | | 257/737 |
| 2013/0077272 A1 | 3/2013 | Lin et al. | | |
| 2014/0242791 A1* | 8/2014 | Yu | .......................... | H01L 24/11 |
| | | | | 438/613 |

\* cited by examiner

SELF-ALIGNED UNDER BUMP METAL

CROSS-REFERENCE TO RELATED APPLICATIONS

This application is a divisional of U.S. Nonprovisional patent application Ser. No. 14/559,215, filed Dec. 3, 2014, which claims the benefit of U.S. Provisional Application Ser. No. 61/918,367, filed Dec. 19, 2013, the contents of both of which is herein incorporated by reference in its entirety.

FIELD OF THE INVENTION

This invention relates to the field of integrated circuits. More particularly, this invention relates to interconnects in integrated circuits.

BACKGROUND OF THE INVENTION

Integrated circuits may have external electrical connections which include solder balls, sometimes referred to as solder bumps or solder pillars. Under bump metal structures may be formed between the solder balls and underlying top level metal interconnects in the integrated circuits. The under bump metal structures may desirably block or slow consumption of metal in the top level interconnects by formation of intermetallic compounds with the solder. Forming the under bump metal structures may involve one or more photolithographic operations, which may undesirably increase fabrication costs and complexities of the integrated circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

Under bump metal pads in an integrated circuit may be formed using a self-aligned process. A connection pad in a top interconnect level of the integrated circuit is overlapped by a dielectric layer, wherein an opening is formed to expose the connection pad. An under bump metal layer is formed on the exposed metal in the connection pad and over the dielectric layer. The under bump metal layer may include more than one sub-layer. Metal may be removed from the under bump metal layers over the dielectric layer using a chemical mechanical polishing (CMP) process or other selective removal process, leaving a self-aligned under bump metal pad in the opening in the dielectric layer. Solder balls are subsequently formed on the self-aligned under bump metal pads.

DETAILED DESCRIPTION OF EXAMPLE EMBODIMENTS

Figure 1A:
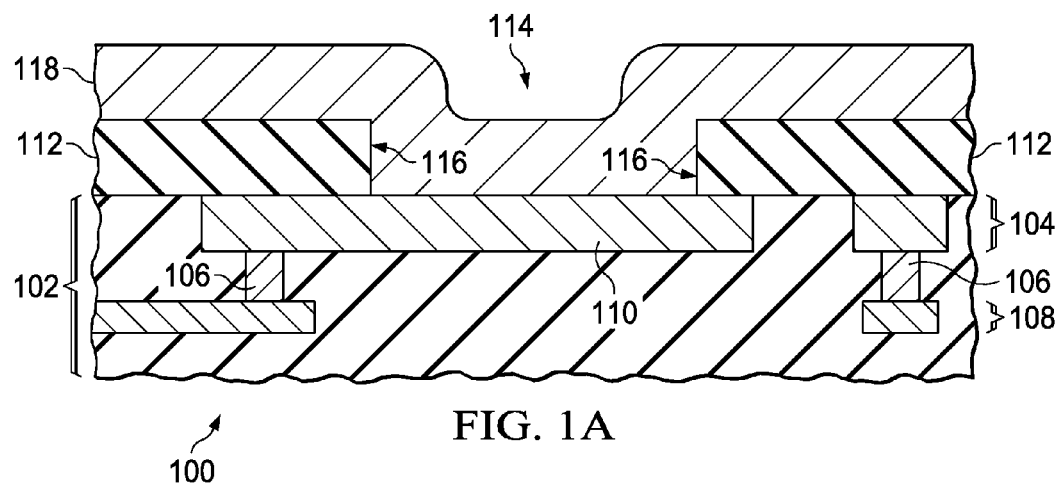
FIG. 1A through FIG. 1D are cross-sections of an integrated circuit with a self-aligned under bump metal pad formed according to a first example, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent application is related and hereby incorporated by reference: U.S. patent application Ser. No. 12/343,915, filed Dec. 24, 2008.

An integrated circuit fabrication process may include forming under bump metal pads using self-aligned processes which do not require photolithographic operations. The integrated circuit has one or more interconnect metal levels, including a top interconnect level. A dielectric layer is formed over the top interconnect level. A connection opening is formed in the dielectric layer over a connection pad in the top interconnect level to expose metal in the connection pad. The dielectric layer overlaps the connection pad around its periphery. One or more under bump metal sub-layers are formed using deposition processes, such as chemical vapor deposition (CVD) or physical vapor deposition (PVD) or electroplating or electroless plating, on the exposed metal in the connection pad and over the dielectric layer. One or more selective metal removal processes such as CMP or resist etch back is used to remove metal from the sub-layers over the dielectric layer. Additional solder pad metal may be formed on the sub-layers in the dielectric layer opening. Solder balls are subsequently formed on the self-aligned under bump metal pad. The solder balls may formed by positioning preformed solder balls using a stencil process, commonly known as ball dropping, by electroplating, by screen printing, by mechanical placement or by other processes.

For the purposes of this description, terms describing elemental formulas of materials without subscripts do not imply a particular stoichiometry of the elements. For example, the term TiSiN describes a material containing titanium (Ti), silicon (Si) and nitrogen (N), not necessarily having a Ti:Si:N atomic ratio of 1:1:1. Terms describing elemental formulas of materials with subscripts imply a stoichiometry given by the subscripts. For example, the term $SiO_2$ describes a material containing silicon and oxygen (O) having a Si:O atomic ratio of 1:2.

FIG. 1A through FIG. 1D are cross-sections of an integrated circuit with a self-aligned under bump metal pad formed according to a first example, depicted in successive stages of fabrication. Referring to FIG. 1A, the integrated circuit 100 includes an interconnect region 102, which further includes a top interconnect level 104, and may possibly include vias 106 and a lower interconnect level 108 if the integrated circuit 100 has a multilevel interconnect architecture. The top interconnect level 104 may be a metallization level or a redistribution level. The top interconnect level 104 includes a connection pad 110. The connection pad 110 may include Cu, Al, or other metal or alloy suitable for providing electrical interconnects in the integrated circuit 100.

A dielectric layer 112 is formed over the top interconnect level 104. The dielectric layer may include inorganic materials such as $SiO_2$, fluorosilicate glass (FSG), organosilicate glass (OSG), SiN, or SiON, or organic materials such as polyimide, polybenzobisoxazole (PBO) or benzylcyclobutene (BCB). A connection opening 114 is formed in the dielectric layer 112. In one realization of the instant example, the connection opening 114 may be formed by a reactive ion etch (RIE) process through a connection photoresist pattern (not shown). In another realization wherein the dielectric layer 112 includes photosensitive material, the connection opening 114 may be formed by a photolithographic process. The connection opening 114 is formed so that a portion of a top surface of the connection pad 110 is exposed while a periphery of the connection pad 110 is overlapped by the dielectric layer 112. A connection opening sidewall 116 is formed at a boundary of the connection opening 114 over the connection pad 110. In one realization of the instant example, the connection opening sidewall 116 may be substantially perpendicular to the top surface of the connection pad 110 as depicted in FIG. 1A. In an alternate realization, the connection opening sidewall 116 may be at an acute or obtuse angle with respect to the top surface of the connection pad 110.

An under bump metal layer 118 is formed on the exposed top surface of the connection pad 110 and over the dielectric layer 112 so as to contact the connection opening sidewall 116. In the instant example, the under bump metal layer 118 includes exactly one sub-layer of metal. In one realization of the instant example, the under bump metal layer 118 may be composed substantially of Cu, Ni, NiV, Pd, Au, Cr, Pt, or any alloy thereof.

Figure 1B:
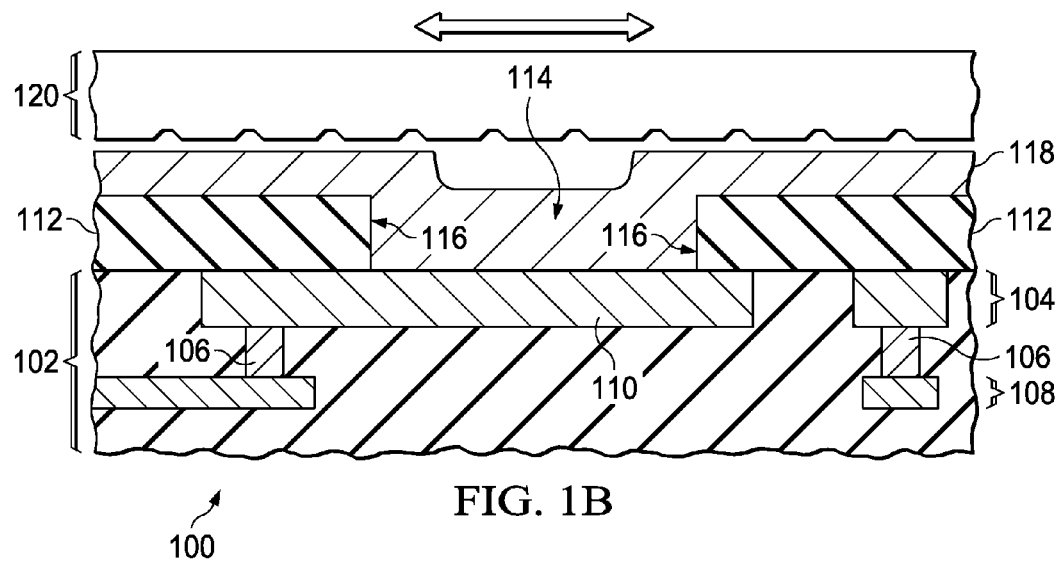

Referring to FIG. 1B, material from the under bump metal layer 118 is removed by a selective removal process 120, depicted schematically in FIG. 1B as a CMP pad in lateral motion. The selective removal process 120 leaves material of the under bump metal layer 118 in the connection opening 114. In one realization of the instant example, the selective removal process 120 may be a CMP process. In another realization, the selective removal process 120 may be a resist etch back process, wherein a planarizing layer such as photoresist is formed over the under bump metal layer 118 and subsequently a planar etch process such as an isotropic RIE is performed. Other realizations of the selective removal process 120 are within the scope of the instant example.

Figure 1C:
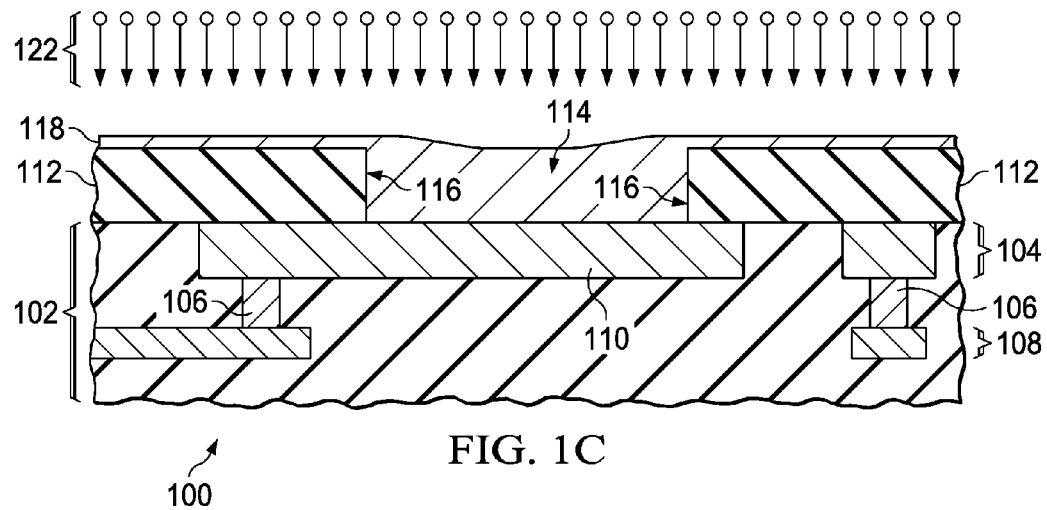

Referring to FIG. 1C, an optional etch process 122 may be performed on the integrated circuit 100 to remove remaining metal of the under bump metal layer 118 from over the dielectric layer 112. The etch process 122 may be a ME process as depicted in FIG. 1C, or may be a wet etch process (not shown).

Figure 1D:
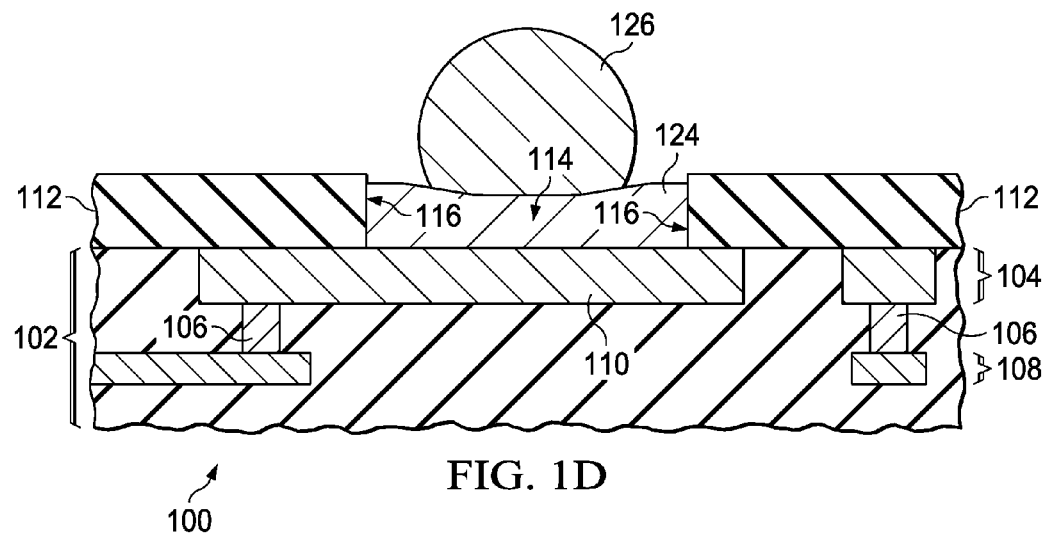

FIG. 1D depicts the integrated circuit 100 after the selective removal process (element 120 of FIG. 1B) and optional etch process (element 122 of FIG. 1C) if performed are completed. Metal of the under bump metal layer (element 118 in FIG. 1A through FIG. 1C) remaining in the connection opening 114 forms a self-aligned under bump metal pad 124. The self-aligned under bump metal pad 124 contacts the sidewall 116 of the connection opening 114. The self-aligned under bump metal pad 124 does not contact the top surface of the dielectric layer 112. A solder ball 126 is formed on the self-aligned under bump metal pad 124. The solder ball may include Pb, Sn, Bi, In, Ga, Sb, Ag, and traces of other metals such as Cu. In one realization of the instant example, the solder ball 126 may be an alloy of 96 percent Sn, 3.5 percent Ag and 0.5 percent Cu. The solder ball 126 may be spherical in shape as depicted in FIG. 1D, or may be cylindrical, rectangular or irregular in shape. The solder ball 126 may be formed by ball dropping, plating, screen printing, mechanical placement, or other process.

During a connection process wherein the solder ball 126 is connected to an external electrical conducting element such as a metal trace on a leadframe or a printed circuit board, the solder ball 126 is heated so that the metal in the solder ball 126 reflows and forms a solder joint to the self-aligned under bump metal pad 124. The metal in the self-aligned under bump metal pad 124 may prevent the metal in the solder ball 126 from forming an intermetallic compound with the connection pad 110. Intermetallic compounds commonly exhibit high electrical resistance and lower mechanical strength than solder joints.

Figure 2A:
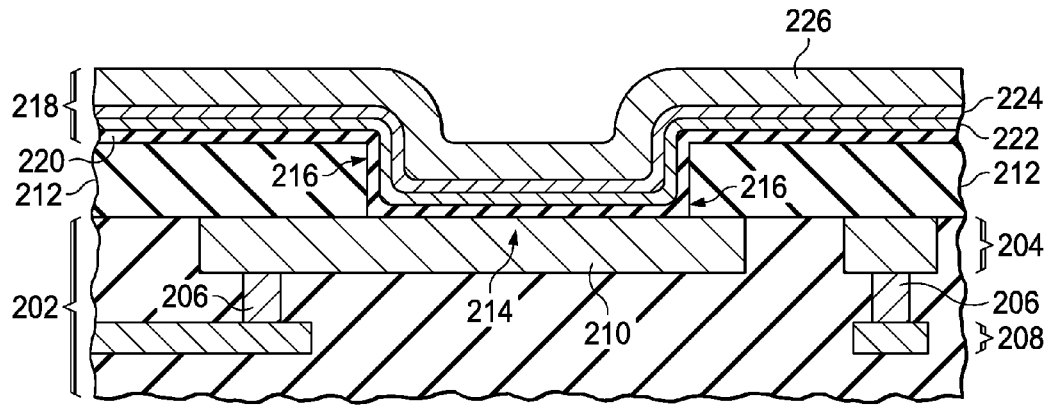
FIG. 2A through FIG. 2C are cross-sections of an integrated circuit with a self-aligned under bump metal pad formed according to a second example, depicted in successive stages of fabrication.
Figure 2B:
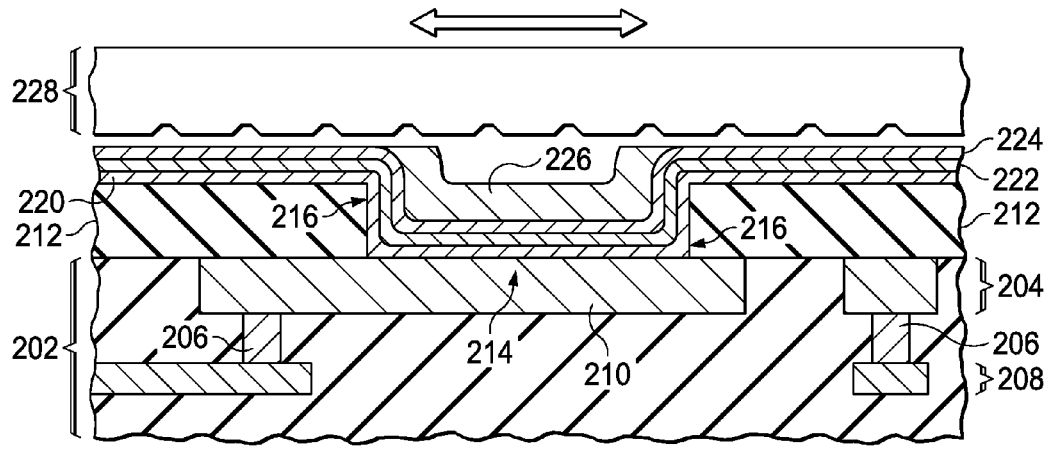
Figure 2C:
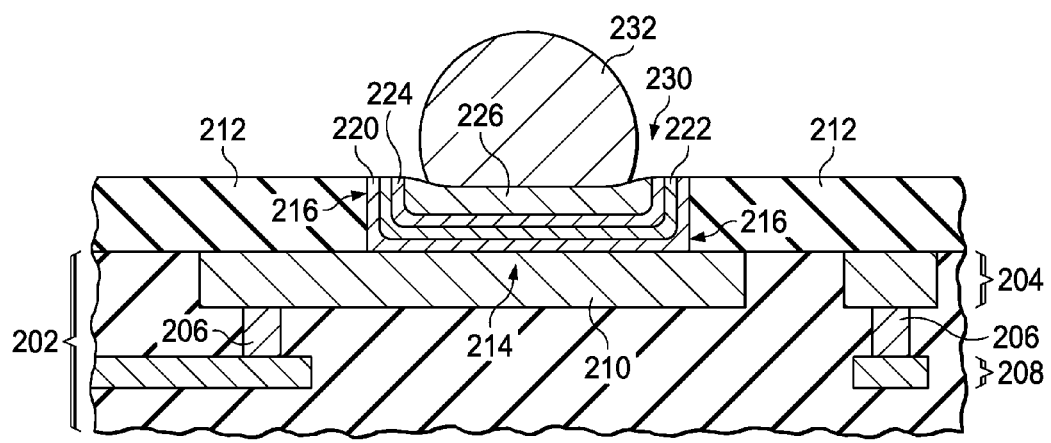

FIG. 2A through FIG. 2C are cross-sections of an integrated circuit with a self-aligned under bump metal pad formed according to a second example, depicted in successive stages of fabrication. Referring to FIG. 2A, the integrated circuit 200 includes an interconnect region 202, which further includes a top interconnect level 204, and may possibly include vias 206 and a lower interconnect level 208. The top interconnect level 204 includes a connection pad 210 as described in reference to FIG. 1A. A dielectric layer 212 is formed over the top interconnect level 204 as described in reference to FIG. 1A. A connection opening 214 is formed in the dielectric layer 212 as described in reference to FIG. 1A. The connection opening 214 is formed so that a portion of a top surface of the connection pad 210 is exposed while a periphery of the connection pad 210 is overlapped by the dielectric layer 212. A connection opening sidewall 216 is formed at a boundary of the connection opening 214 over the connection pad 210 as described in reference to FIG. 1A.

An under bump metal layer 218 is formed on the exposed top surface of the connection pad 210 and over the dielectric layer 212 so as to contact the connection opening sidewall 216. In the instant example, the under bump metal layer 218 includes at least one of a metal adhesion sub-layer 220 and a metal blocking sub-layer 222. In one realization of the instant example, the adhesion sub-layer 220 if present may be less than one-third as thick as the dielectric layer 212, and may be continuous along the connection opening sidewall 116. The adhesion sub-layer 220 may include Ta, TaN, TaSiN, Ti, TiW, WN, WSiN, TiN, TiSiN or other metal with suitable adhesion properties to the connection pad 210. In one realization of the instant example, the adhesion sub-layer 220 may consist substantially of TaN. In one realization of the instant example, the blocking sub-layer 222 if present may be less than one-half as thick as the dielectric layer 212, and may be continuous along the connection opening sidewall 216. The blocking sub-layer 222 may include Ni, Cr, NiV or other metal which forms intermetallic compounds with a subsequently formed solder ball at a rate at least as slow as Cu. In one realization of the instant example, the blocking sub-layer 222 may consist substantially of Ni. In another realization, the blocking sub-layer 222 may consist substantially of NiV. The under bump metal layer 218 may also include an optional metal cap sub-layer 224 subsequently formed over the adhesion sub-layer 220 if present and blocking sub-layer 222 if present. In a further realization, the cap sub-layer 224 may be less than one-fourth as thick as the dielectric layer 212, and may be continuous along the connection opening sidewall 216. The cap sub-layer 224 may include Pd, Pt, Au, Ag or other metal with a native oxide less than 10 nanometers thick. In one realization of the instant example, the cap sub-layer 224 may consist substantially of Pd. The under bump metal layer 218 further includes a solder connection sub-layer 226 formed over the other sub-layers 220, 222, 224 present. In one realization of the instant example, the solder connection sub-layer 226 may be at least one-half as thick as the dielectric layer 212, and may include Cu, Ni, NiV, Pd, Au, Cr, Pt, or any alloy thereof. In one realization of the instant example, the solder connection sub-layer 226 may include more than 90 percent electroplated Cu.

Referring to FIG. 2B, material is removed from the solder connection sub-layer 226 and the other sub-layers 220, 222, 224 present by a selective removal process 228 as described in reference to FIG. 1B. An optional etch process (not shown) may be performed on the integrated circuit 200 to remove remaining metal from over the dielectric layer 212 as described in reference to FIG. 1C.

FIG. 2C depicts the integrated circuit 200 after the selective removal process (element 228 of FIG. 2B) and optional etch process if performed are completed. Metal of the under bump metal layer (element 218 in FIG. 2A) remaining in the connection opening 214 forms a self-aligned under bump metal pad 230. The self-aligned under bump metal pad 230 contacts the sidewall 216 of the connection opening 214. The self-aligned under bump metal pad 230 does not contact the top surface of the dielectric layer 212. A solder ball 232 is formed on the self-aligned under bump metal pad 230 as described in reference to FIG. 1D.

The solder connection sub-layer 226 may provide a desired low electrical resistance solder joint to the solder ball 232 with a desired high mechanical strength. The blocking sub-layer 222 may prevent the metal in the solder ball 232 from forming an intermetallic compound with the connection pad 210. The adhesion sub-layer 220 may provide a desired level of mechanical adhesion between the self-aligned under bump metal pad 230 and the connection pad 210. The cap sub-layer 224 if present may prevent oxidation of the blocking sub-layer 222 during fabrication of the integrated circuit 200. It is within the scope of the instant example to form the self-aligned under bump metal pad 230 with more sub-layers than those depicted in FIG. 2A through FIG. 2C.

Figure 3A:
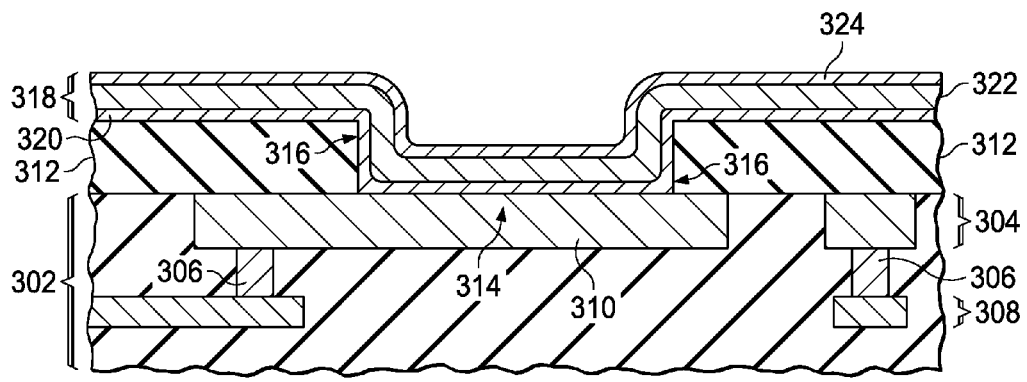
FIG. 3A through FIG. 3C are cross-sections of an integrated circuit with a self-aligned under bump metal pad formed according to a third example, depicted in successive stages of fabrication.
Figure 3B:
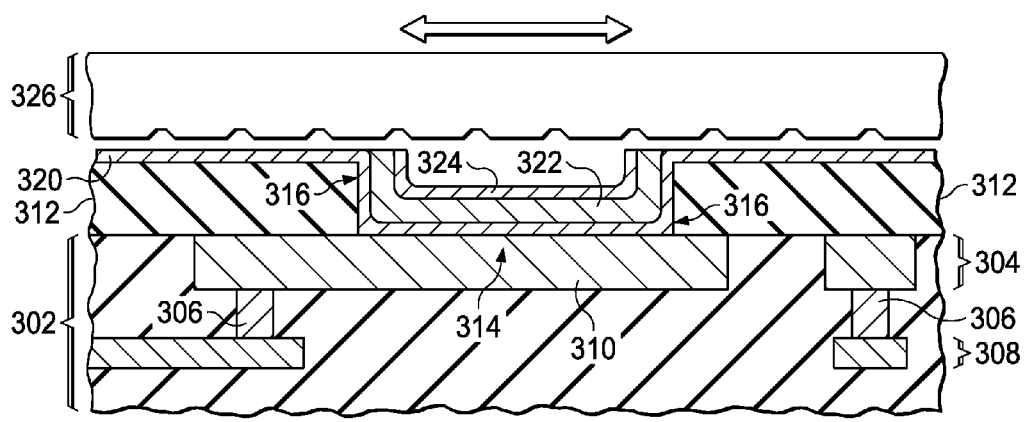
Figure 3C:
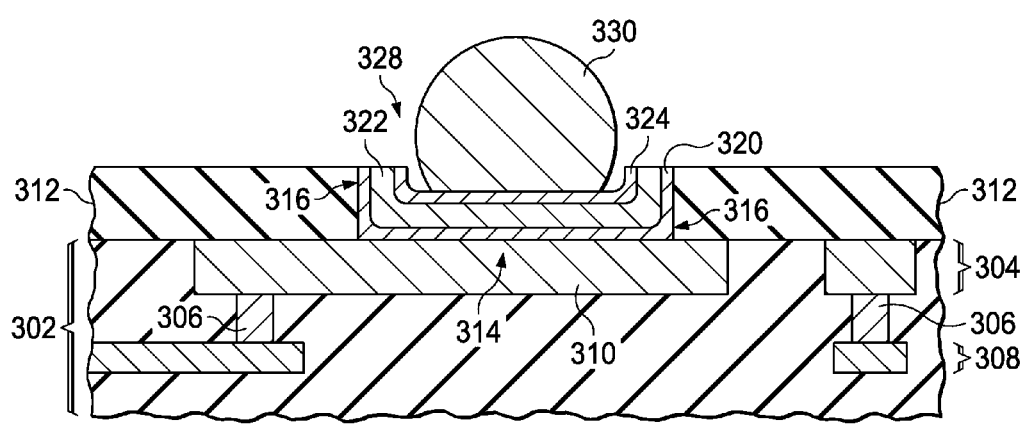

FIG. 3A through FIG. 3C are cross-sections of an integrated circuit with a self-aligned under bump metal pad formed according to a third example, depicted in successive stages of fabrication. Referring to FIG. 3A, the integrated circuit 300 includes an interconnect region 302, which further includes a top interconnect level 304, and may possibly include vias 306 and a lower interconnect level 308. The top interconnect level 304 includes a connection pad 310 as described in reference to FIG. 1A. A dielectric layer 312 is formed over the top interconnect level 304 as described in reference to FIG. 1A. A connection opening 314 is formed in the dielectric layer 312 as described in reference to FIG. 1A. The connection opening 314 is formed so that a portion of a top surface of the connection pad 310 is exposed while a periphery of the connection pad 310 is overlapped by the dielectric layer 312. A connection opening sidewall 316 is formed at a boundary of the connection opening 314 over the connection pad 310 as described in reference to FIG. 1A.

An under bump metal layer 318 is formed on the exposed top surface of the connection pad 310 and over the dielectric layer 312 so as to contact the connection opening sidewall 316. In the instant example, the under bump metal layer 318 includes a metal adhesion sub-layer 320 and a metal solder connection/blocking sub-layer 322. In one realization of the instant example, the adhesion sub-layer 320 may be less than one-third as thick as the dielectric layer 312, and may be continuous along the connection opening sidewall 316. The adhesion sub-layer 320 may include Ta, TaN, TaSiN, Ti, TiW, WN, WSiN, TiN, TiSiN or other metal with suitable adhesion properties to the connection pad 310. In one realization of the instant example, the adhesion sub-layer 320 may consist substantially of TaN. In one realization of the instant example, the solder connection/blocking sub-layer 322 may be less than two-thirds as thick as the dielectric layer 312, and may be continuous along the connection opening sidewall 316. The solder connection/blocking sub-layer 322 may include Ni, Cr, NiV or other metal which forms a desired solder joint with a subsequently formed solder ball, but forms intermetallic compounds with the solder ball at a rate at least as slow as Cu. In one realization of the instant example, the solder connection/blocking sub-layer 322 may consist substantially of Ni. In another realization, the solder connection/blocking sub-layer 322 may consist substantially of NiV. The under bump metal layer 318 may also include an optional metal cap sub-layer 324 subsequently formed over the solder connection/blocking sub-layer 322. In a further realization, the cap sub-layer 324 may be less than one-fourth as thick as the dielectric layer 312, and may be continuous along the connection opening sidewall 316. The cap sub-layer 324 may include Pd, Pt, Au, Ag or other metal with a native oxide less than 10 nanometers thick. In one realization of the instant example, the cap sub-layer 324 may consist substantially of Pd.

Referring to FIG. 3B, material is removed from the adhesion sub-layer 320, the solder connection/blocking sub-layer 322 and the cap sub-layer 324 if present by a selective removal process 326 as described in reference to FIG. 1B. An optional etch process (not shown) may be performed on the integrated circuit 300 to remove remaining metal from over the dielectric layer 312 as described in reference to FIG. 1C.

FIG. 3C depicts the integrated circuit 300 after the selective removal process (element 326 of FIG. 3B) and optional etch process if performed are completed. Metal of the under bump metal layer (element 318 in FIG. 3A) remaining in the connection opening 314 forms a self-aligned under bump metal pad 328. The self-aligned under bump metal pad 328 contacts the sidewall 316 of the connection opening 314. The self-aligned under bump metal pad 328 does not contact the top surface of the dielectric layer 312. A solder ball 330 is formed on the self-aligned under bump metal pad 328 as described in reference to FIG. 1D.

The adhesion sub-layer 320 may provide a desired level of mechanical adhesion between the self-aligned under bump metal pad 328 and the connection pad 310. The solder connection/blocking sub-layer 322 may provide a desired low electrical resistance solder joint to the solder ball 232 and a desired high mechanical strength, while preventing the metal in the solder ball 330 from forming an intermetallic compound with the connection pad 310. The cap sub-layer 324 if present may prevent oxidation of the solder connection/blocking sub-layer 322 during fabrication of the integrated circuit 300. It is within the scope of the instant example to form the self-aligned under bump metal pad 328 with more sub-layers than those depicted in FIG. 3A through FIG. 3C.

Figure 4A:
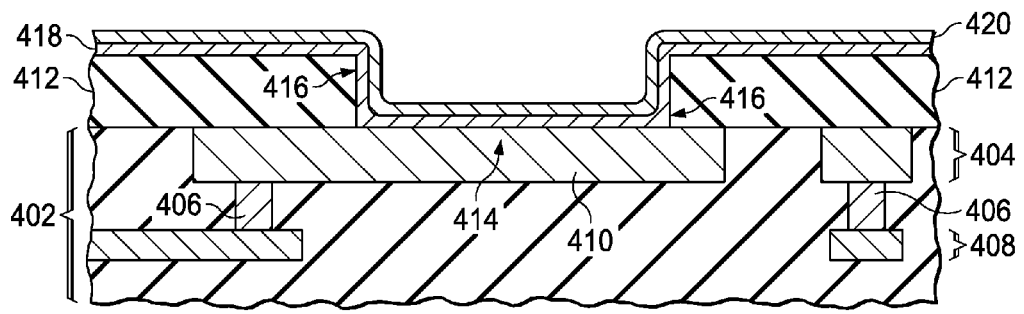
FIG. 4A through FIG. 4F are cross-sections of an integrated circuit with a self-aligned under bump metal pad formed according to a fourth example, depicted in successive stages of fabrication.

FIG. 4A through FIG. 4F are cross-sections of an integrated circuit with a self-aligned under bump metal pad formed according to a fourth example, depicted in successive stages of fabrication. Referring to FIG. 4A, the integrated circuit 400 includes an interconnect region 402, which further includes a top interconnect level 404, and may possibly include vias 406 and a lower interconnect level 408. The top interconnect level 404 includes a connection pad 410 as described in reference to FIG. 1A. A dielectric layer 412 is formed over the top interconnect level 404 as described in reference to FIG. 1A. A connection opening 414 is formed in the dielectric layer 412 as described in reference to FIG. 1A. The connection opening 414 is formed so that a portion of a top surface of the connection pad 410 is exposed while a periphery of the connection pad 410 is overlapped by the dielectric layer 412. A connection opening sidewall 416 is formed at a boundary of the connection opening 414 over the connection pad 410 as described in reference to FIG. 1A.

A first metal sub-layer 418 is formed on the exposed top surface of the connection pad 410 and over the dielectric layer 412 so as to contact the connection opening sidewall 416. In one realization of the instant example, the first sub-layer 418 may be less than one-third as thick as the dielectric layer 412, and may be continuous along the connection opening sidewall 416. An optional second metal sub-layer 420 may be formed on an exposed surface of the first sub-layer 418. In one realization of the instant example, the second sub-layer 420 if present may be less than one-third as thick as the dielectric layer 412, and may be continuous along the connection opening sidewall 416.

In one realization of the instant example, the first sub-layer 418 may be an adhesion layer and include Ta, TaN, TaSiN, Ti, TiW, WN, WSiN, TiN, TiSiN or other metal with suitable adhesion properties to the connection pad 410, and the second sub-layer 420 may be a blocking layer and include Ni, NiV, Cr or other metal which forms intermetallic compounds with a subsequently formed solder ball at a rate at least as slow as Cu. In an alternate realization, the first sub-layer 418 may be blocking layer, and the second sub-layer 420 may be a cap layer and include Pd, Pt, Au, Ag or other metal with a native oxide less than 10 nanometers thick. In another realization, the first sub-layer 418 may be blocking layer, and the second sub-layer 420 may not be formed. It is within the scope of the instant example to form one or more additional sub-layers on the integrated circuit 400.

Figure 4B:
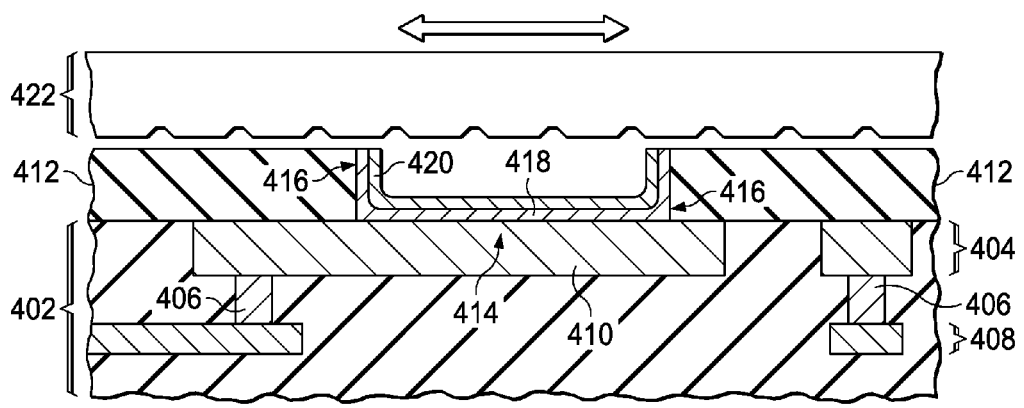

Referring to FIG. 4B, material is removed from the first sub-layer 418 and the second sub-layer 420 if present by a selective removal process 422 as described in reference to FIG. 1B. An optional etch process (not shown) may be performed on the integrated circuit 400 to remove remaining metal from over the dielectric layer 412 as described in reference to FIG. 1C.

Figure 4C:
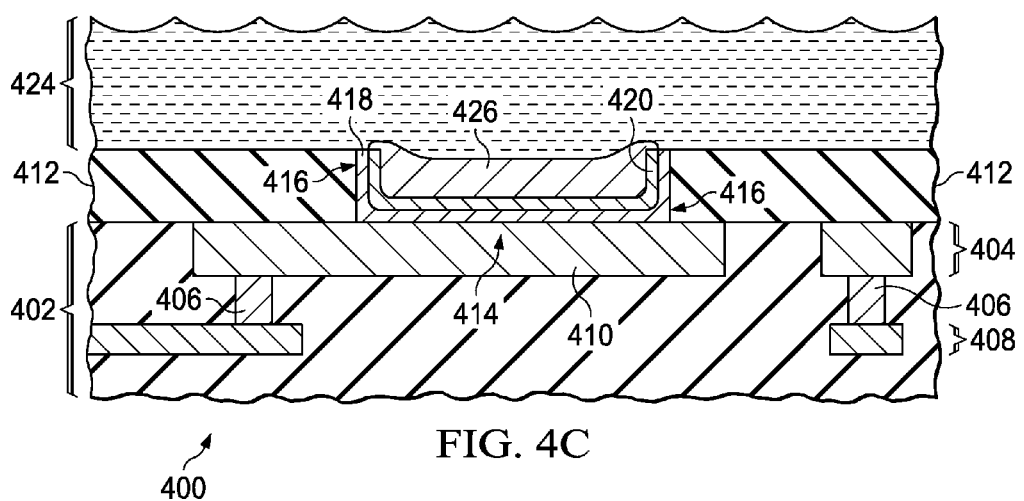

Referring to FIG. 4C, an electroless plating operation 424 is performed which forms a solder connection pad 426 on a top surface of a top metal layer in the connection opening 414. The solder connection pad 426 may include Cu, Ni, NiV, Au, Cr, Pd, or any other metal which forms a desired solder joint with the solder ball and can be electrolessly plated. In one realization of the instant example, the solder connection pad 426 may include more than one electrolessly plated metal sub-layer.

Figure 4D:
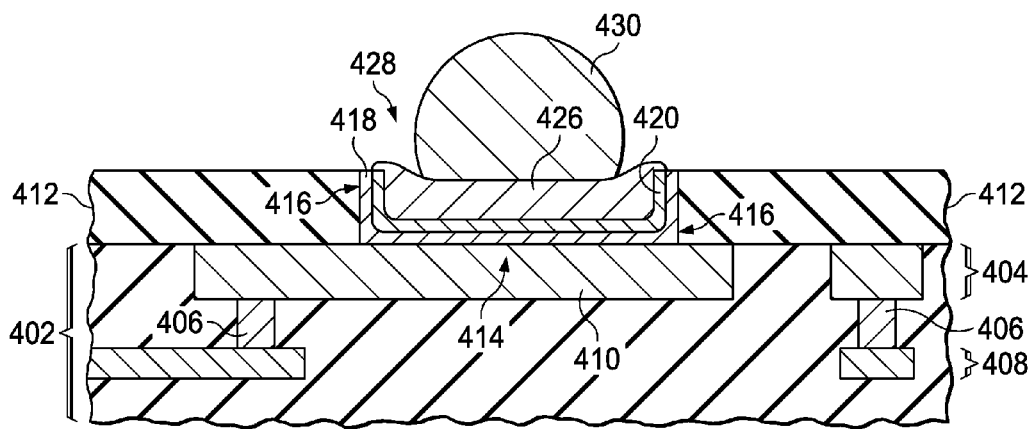

FIG. 4D depicts the integrated circuit 400 at a subsequent stage of fabrication. The first sub-layer 418, the second sub-layer 420 if present, any additional sub-layers if present, and the solder connection pad 426 form a self-aligned under bump metal pad 428. The self-aligned under bump metal pad 428 contacts the sidewall 416 of the connection opening 414. The self-aligned under bump metal pad 428 does not contact the top surface of the dielectric layer 412. In the realization of the instant example depicted in FIG. 4D, the solder connection pad 426 is between one-third and two-thirds as thick as the dielectric layer 412. A solder ball 430 is formed on the self-aligned under bump metal pad 428 as described in reference to FIG. 1D.

Figure 4E:
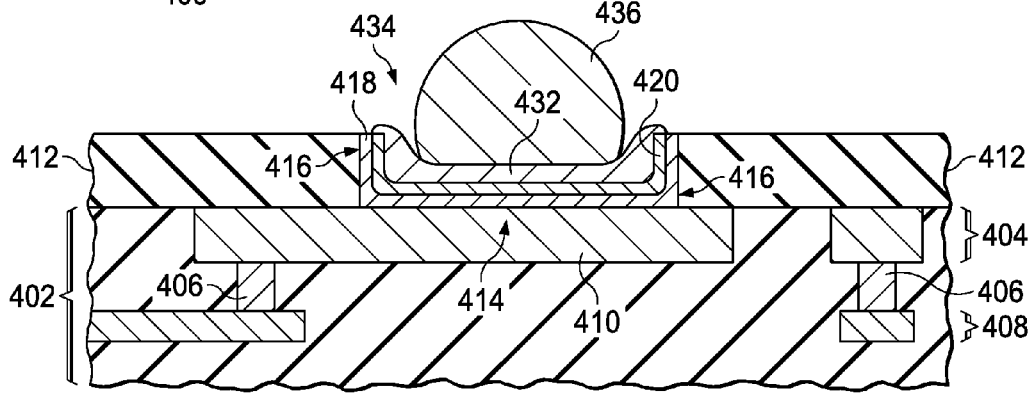

FIG. 4E depicts the integrated circuit 400 formed according to an alternate realization of the instant example. A thin solder connection pad 432, formed as described in reference to FIG. 4C, is less than one-third as thick as the dielectric layer 412. The first sub-layer 418, the second sub-layer 420 if present, any additional sub-layers if present, and the thin solder connection pad 432 form an alternate self-aligned under bump metal pad 434. A solder ball 436 is formed on the alternate self-aligned under bump metal pad 434 as described in reference to FIG. 1D.

Figure 4F:
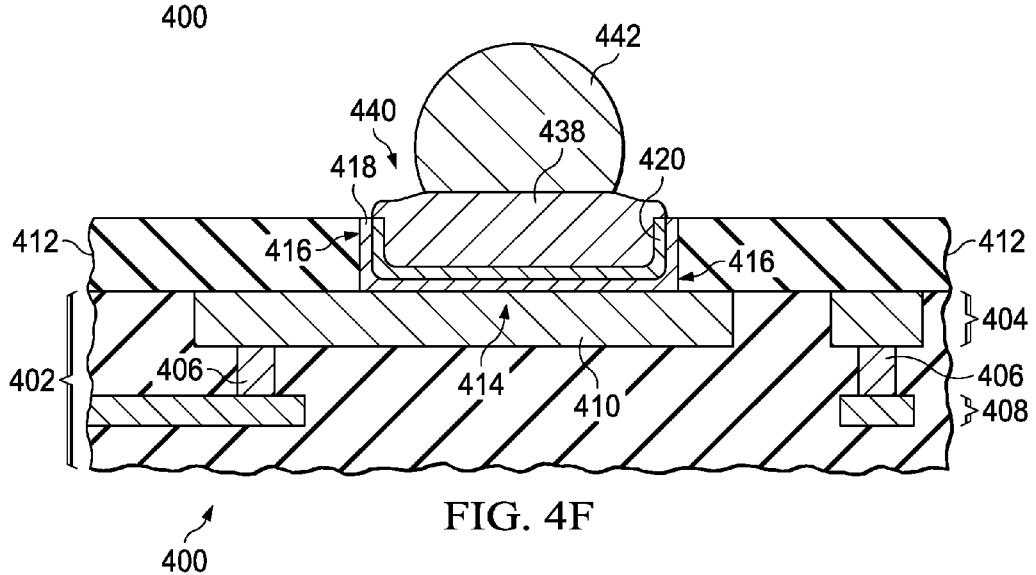

FIG. 4F depicts the integrated circuit 400 formed according to a second alternate realization of the instant example. A thick solder connection pad 438, formed as described in reference to FIG. 4C, is greater than two-thirds as thick as the dielectric layer 412. The first sub-layer 418, the second sub-layer 420 if present, any additional sub-layers if present, and the thick solder connection pad 438 form a second alternate self-aligned under bump metal pad 440. A solder ball 442 is formed on the second alternate self-aligned under bump metal pad 440 as described in reference to FIG. 1D.

The metal sub-layers of the self-aligned under bump metal pads 428, 434, 440 described in the instant example may provide the functions recited in reference to the examples described in reference to FIG. 2C and FIG. 3C.

Figure 5A:
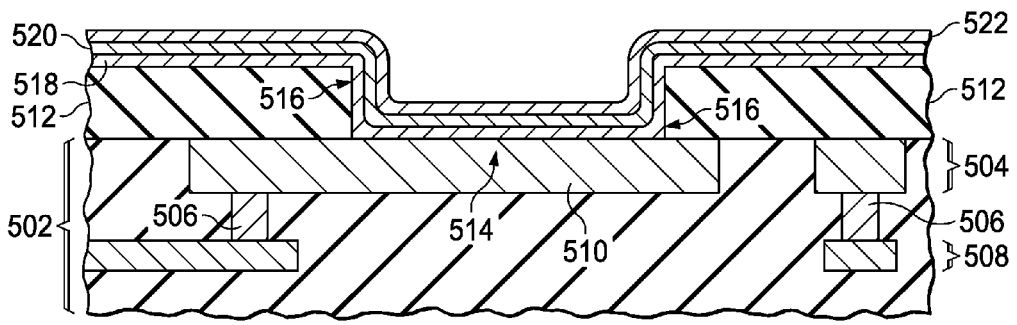
FIG. 5A through FIG. 5E are cross-sections of an integrated circuit with a self-aligned under bump metal pad formed according to a fifth example, depicted in successive stages of fabrication.

FIG. 5A through FIG. 5E are cross-sections of an integrated circuit with a self-aligned under bump metal pad formed according to a fifth example, depicted in successive stages of fabrication. Referring to FIG. 5A, the integrated circuit 500 includes an interconnect region 502, which further includes a top interconnect level 504, and may possibly include vias 506 and a lower interconnect level 508. The top interconnect level 504 includes a connection pad 510 as described in reference to FIG. 1A. A dielectric layer 512 is formed over the top interconnect level 504 as described in reference to FIG. 1A. A connection opening 514 is formed in the dielectric layer 512 as described in reference to FIG. 1A. The connection opening 514 is formed so that a portion of a top surface of the connection pad 510 is exposed while a periphery of the connection pad 510 is overlapped by the dielectric layer 512. A connection opening sidewall 516 is formed at a boundary of the connection opening 514 over the connection pad 510 as described in reference to FIG. 1A.

A first metal sub-layer 518 is formed on the exposed top surface of the connection pad 510 and over the dielectric layer 512 so as to contact the connection opening sidewall 516. In one realization of the instant example, the first sub-layer 518 may be less than one-third as thick as the dielectric layer 512, and may be continuous along the connection opening sidewall 516. An optional second metal sub-layer 520 may be formed on an exposed surface of the first sub-layer 518. In one realization of the instant example, the second sub-layer 520 if present may be less than one-third as thick as the dielectric layer 512, and may be continuous along the connection opening sidewall 516. An optional third metal sub-layer 522 may be formed on an exposed surface of the second sub-layer 520. In one realization of the instant example, the third sub-layer 522 if present may be less than one-third as thick as the dielectric layer 512, and may be continuous along the connection opening sidewall 516. It is within the scope of the instant example to form one or more additional sub-layers on the integrated circuit 500.

In one realization of the instant example, the first sub-layer 518 may be an adhesion layer of TaN, the second sub-layer 520 may be a blocking layer of Ni or NiV, and the third metal sub-layer 522 may be a cap layer of Pd which protects the blocking layer during subsequent fabrication steps.

Figure 5B:
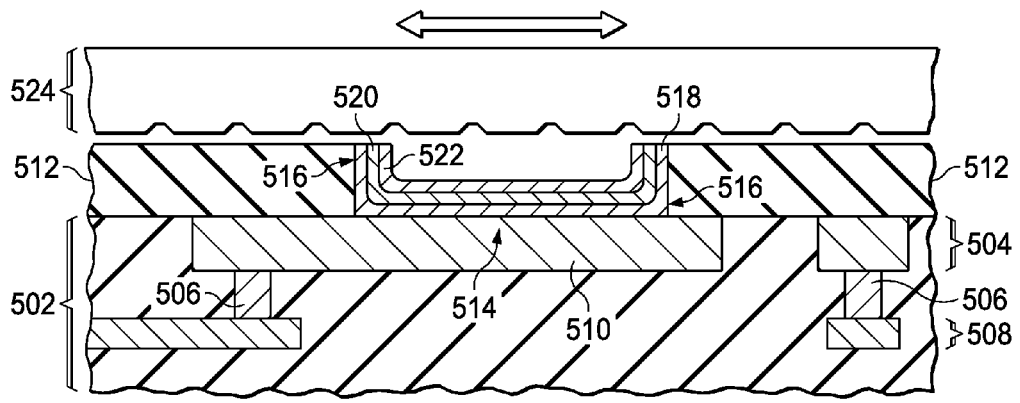

Referring to FIG. 5B, material is removed from the first sub-layer 518 and the second sub-layer 520 if present and the third sub-layer 522 if present by a first selective removal process 524 as described in reference to FIG. 1B. An optional first etch process (not shown) may be performed on the integrated circuit 500 to remove remaining metal from over the dielectric layer 512 as described in reference to FIG. 1C.

Figure 5C:
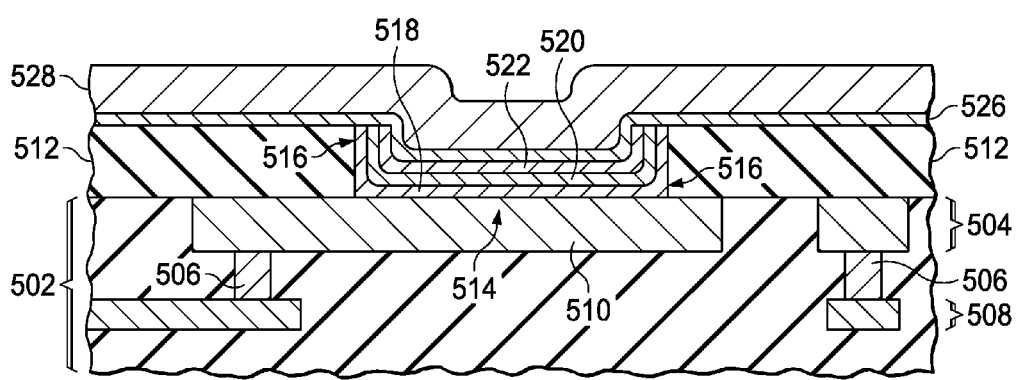

Referring to FIG. 5C, an optional metal seed sub-layer 526 is formed on a top surface of a top metal layer in the connection opening 514 and over the dielectric layer 512. The seed sub-layer 526 if present may be less than one-third as thick as the dielectric layer 512, and may be continuous along the connection opening sidewall 516. The seed sub-layer 526 may include Cu, Ni, Cr, NiV or other metal which provides a suitable layer for subsequently electroplating a solder connection sub-layer.

A metal solder connection sub-layer 528 is formed on a top surface of a top metal layer in the connection opening 514 and over the dielectric layer 512. In realizations of the instant example wherein the seed sub-layer 526 is present, the solder connection sub-layer 528 may be electroplated. In other realizations, the solder connection sub-layer 528 may be formed by sputtering, evaporation or other process. In one realization of the instant example, the solder connection sub-layer 528 may more than one-third as thick as the dielectric layer 512. The solder connection sub-layer 528 may include Cu, Ni, NiV, Cr, Pd, Au, Ag or other metal which provides a suitable solder connection to a subsequently formed solder ball.

Figure 5D:
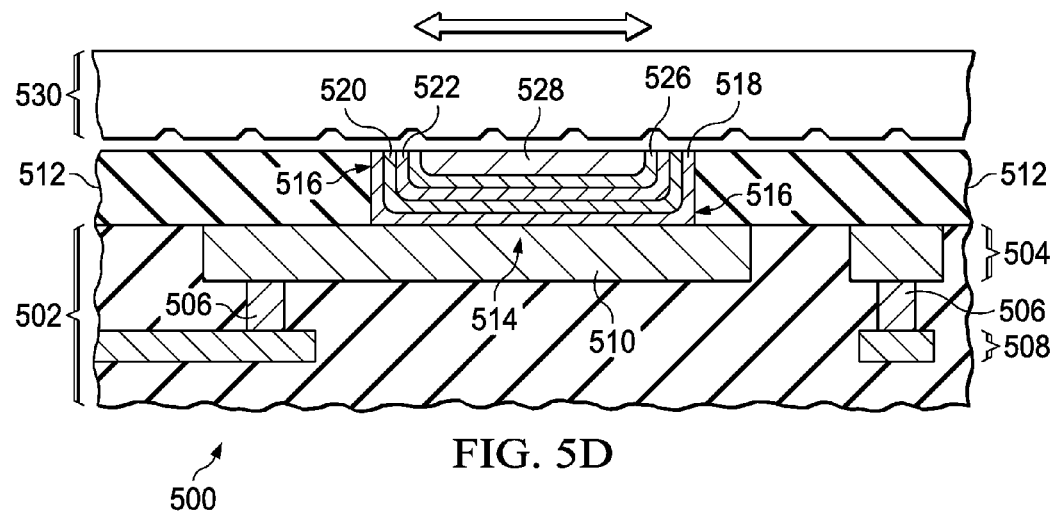

Referring to FIG. 5D, metal is removed from the solder connection sub-layer 528 and the seed sub-layer 526 if present by a second selective removal process 530 as described in reference to FIG. 1B. An optional second etch process (not shown) may be performed on the integrated circuit 500 to remove remaining metal from over the dielectric layer 512 as described in reference to FIG. 1C.

Figure 5E:
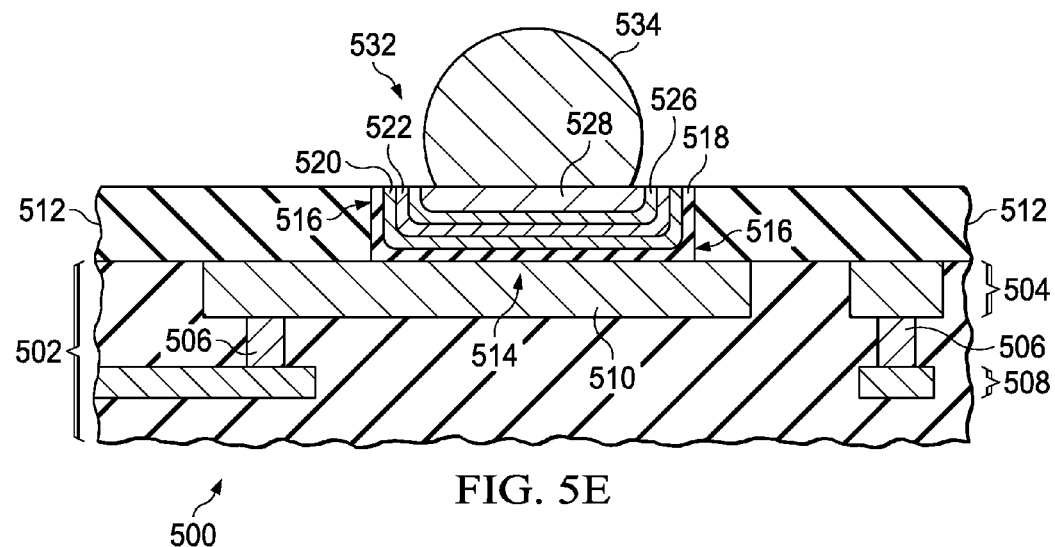

FIG. 5E depicts the integrated circuit 500 after the second selective removal process (element 528 of FIG. 5D) and optional second etch process if performed are completed. Metal of the solder connection sub-layer 528, the seed sub-layer 526 if present, the second sub-layer 520 if present and the first sub-layer 518 remaining in the connection opening 514 form a self-aligned under bump metal pad 532. The self-aligned under bump metal pad 532 contacts the sidewall 516 of the connection opening 514. The self-aligned under bump metal pad 532 does not contact the top surface of the dielectric layer 512. A solder ball 534 is formed on the self-aligned under bump metal pad 532 as described in reference to FIG. 1D.

The metal sub-layers 518, 520, 522, 526, 528 of the self-aligned under bump metal pad 532 described in the instant example may provide the functions recited in reference to the examples described in reference to FIG. 2C and FIG. 3C.

While various examples of the present invention have been described above, it should be understood that they have been presented by way of example only and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

What is claimed is:

1. A method of forming an integrated circuit, comprising;
    forming an interconnect region;
    forming a top interconnect level in the interconnect region, so that the top interconnect level includes a connection pad;
    forming a dielectric layer over the top interconnect level;
    forming a connection opening in the dielectric layer such that a portion of a top surface of the connection pad is exposed, while the dielectric layer overlaps a periphery of the connection pad, and such that a connection opening sidewall is formed at a boundary of the dielectric layer over the connection pad;
    forming an under bump metal layer on the exposed portion of the top surface of the connection pad and over the dielectric layer, such that the under bump metal layer contacts the connection opening sidewall;
    selectively removing material from the under bump metal layer over the dielectric layer so as to form a self-aligned under bump metal pad, such that the self-aligned under bump metal pad contacts the connection opening sidewall, and such that the self-aligned under bump metal pad does not contact a top surface of the dielectric layer; and
    forming a solder ball on a top surface of the self-aligned under bump metal pad.

2. The method of claim 1, wherein the self-aligned under bump metal pad consists of a single layer of metal.

3. The method of claim 1, wherein the step of forming the under bump metal layer includes:
    forming at least one of a metal adhesion sub-layer and a metal blocking sub-layer, wherein the adhesion sub-layer if formed is formed on the exposed portion of the connection pad, is continuous along the connection opening sidewall, and is less than one-third as thick as the dielectric layer, and the blocking sub-layer if formed is continuous along the connection opening sidewall, and is less than one-half as thick as the dielectric layer; and forming a solder connection sub-layer over the adhesion sub-layer if formed and the blocking sub-layer if formed, wherein the solder connection sub-layer is at least one-half as thick as the dielectric layer.

4. The method of claim 3, wherein:
the adhesion sub-layer is formed and consists substantially of TaN;
the blocking sub-layer is formed and includes more than 50 percent Ni;
the cap sub-layer is formed and consists substantially of Pd; and
the step of forming the solder connection sub-layer includes a step of electroplating a Cu sub-layer.

5. The method of claim 1, wherein the step of forming the under bump metal layer includes:
forming a metal adhesion sub-layer on the exposed portion of the connection pad, wherein the adhesion sub-layer is continuous along the connection opening sidewall, and is less than one-third as thick as the dielectric layer;
forming a metal solder connection/blocking sub-layer on the adhesion layer, wherein the solder connection/blocking sub-layer is continuous along the connection opening sidewall, and is less than one-half as thick as the dielectric layer.

6. The method of claim 5, wherein:
the adhesion sub-layer consists substantially of TaN;
the solder connection/blocking sub-layer includes more than 50 percent Ni; and
the step of forming the under bump metal layer further includes forming a cap sub-layer on a top surface of the solder connection/blocking sub-layer, such that the cap sub-layer is less than one-fourth as thick as the dielectric layer, is continuous along the connection opening sidewall, and consists substantially of Pd.

7. A method of forming an integrated circuit, comprising:
forming an interconnect region;
forming a top interconnect level in the interconnect region, so that the top interconnect level includes a connection pad;
forming a dielectric layer over the top interconnect level;
forming a connection opening in the dielectric layer such that a portion of a top surface of the connection pad is exposed, while the dielectric layer overlaps a periphery of the connection pad, and such that a connection opening sidewall is formed at a boundary of the dielectric layer over the connection pad;
forming a first metal sub-layer on the exposed portion of the top surface of the connection pad and over the dielectric layer, wherein the first sub-layer is continuous along the connection opening sidewall, and is less than one-third as thick as the dielectric layer;
forming a second metal sub-layer on an exposed surface of the first sub-layer, wherein the second sub-layer is continuous along the connection opening sidewall, and is less than one-third as thick as the dielectric layer;
selectively removing material from the first sub-layer and the second sub-layer over the dielectric layer, and such that the first sub-layer and the second sub-layer do not contact a top surface of the dielectric layer;
forming a metal solder connection pad on an exposed surface of the second sub-layer by a process of electroless plating; and
forming a solder ball on a top surface of the solder connection pad.

8. A method of forming an integrated circuit, comprising:
forming an interconnect region;
forming a top interconnect level in the interconnect region, so that the top interconnect level includes a connection pad;
forming a dielectric layer over the top interconnect level;
forming a connection opening in the dielectric layer such that a portion of a top surface of the connection pad is exposed, while the dielectric layer overlaps a periphery of the connection pad, and such that a connection opening sidewall is formed at a boundary of the dielectric layer over the connection pad;
forming a first metal sub-layer on the exposed portion of the top surface of the connection pad and over the dielectric layer, wherein the first sub-layer is continuous along the connection opening sidewall, and is less than one-third as thick as the dielectric layer;
forming a second metal sub-layer on an exposed surface of the first sub-layer, wherein the second sub-layer is continuous along the connection opening sidewall, and is less than one-third as thick as the dielectric layer;
selectively removing material from the first sub-layer and the second sub-layer over the dielectric layer, and such that the first sub-layer and the second sub-layer do not contact a top surface of the dielectric layer;
forming a metal seed sub-layer on an exposed portion of the second sub-layer an over the dielectric layer;
forming a metal solder connection sub-layer on an exposed surface of the seed sub-layer by a process of electroplating;
selectively removing material from the seed sub-layer and the solder connection sub-layer over the dielectric layer, and such that the seed sub-layer and the solder connection sub-layer do not overlap the dielectric layer; and
forming a solder ball on a top surface of the solder connection sub-layer.

9. The method of claim 8, wherein:
the first sub-layer consists substantially of TaN;
the second sub-layer includes more than 50 percent Ni;
the seed sub-layer consists substantially of Cu; and
the solder connection sub-layer consists substantially of Cu.

10. The method of claim 9, further including forming a Pd sublayer on an exposed surface of the second sub-layer, the Pd sublayer being formed prior to the step of selectively removing material from the first sub-layer and the second sub-layer.

* * * * *